(12) United States Patent  (10) Patent No.: US 9,235,115 B2
Caigoy  (45) Date of Patent: Jan. 12, 2016

(54) OPTICAL AIR SLIT AND METHOD FOR MANUFACTURING OPTICAL AIR SLITS

(71) Applicant: RAYTHEON COMPANY, Waltham, MA (US)

(72) Inventor: Arturo L. Caigoy, Norco, CA (US)

(73) Assignee: RAYTHEON COMPANY, Waltham, MA (US)

( * ) Notice: Subject to any disclaimer, the term of this patent is extended or adjusted under 35 U.S.C. 154(b) by 0 days.

(21) Appl. No.: 14/444,294

(22) Filed: Jul. 28, 2014

(65) Prior Publication Data

US 2014/0335458 A1 Nov. 13, 2014

Related U.S. Application Data

(62) Division of application No. 13/278,254, filed on Oct. 21, 2011, now abandoned.

(51) Int. Cl.
| | |
|---|---|
| *B29D 11/00* | (2006.01) |
| *G03F 7/00* | (2006.01) |
| *G02B 5/00* | (2006.01) |
| *G03F 7/40* | (2006.01) |
| *G03F 7/20* | (2006.01) |
| *G01J 3/02* | (2006.01) |

(52) U.S. Cl.
CPC .............. *G03F 7/0035* (2013.01); *G02B 5/005* (2013.01); *G03F 7/20* (2013.01); *G03F 7/40* (2013.01); *G01J 3/0229* (2013.01); *Y10T 428/24314* (2015.01)

(58) Field of Classification Search
CPC ............ G03F 7/0035; G03F 7/20; G03F 7/40
USPC ............................................................ 216/24
See application file for complete search history.

(56) References Cited

U.S. PATENT DOCUMENTS

| | | | |
|---|---|---|---|
| 3,374,705 A | 3/1968 | Ott, Sr. | |
| 5,384,662 A | 1/1995 | Andresen et al. | |
| 5,781,331 A | 7/1998 | Carr et al. | |
| 6,238,581 B1 * | 5/2001 | Hawkins et al. ................. 216/13 |
| 6,248,509 B1 * | 6/2001 | Sanford ................. G02B 26/02 |
| | | | 430/396 |
| 6,552,788 B1 | 4/2003 | Castle | |
| 6,738,338 B1 * | 5/2004 | Maeda ................. G11B 7/1387 |
| | | | 369/112.01 |
| 6,862,097 B2 | 3/2005 | Yanagisawa et al. | |
| 6,956,688 B2 | 10/2005 | Hoshino | |
| 2006/0009038 A1 | 1/2006 | Cohen et al. | |

OTHER PUBLICATIONS

Victor White, Ultra-Black, Ultra-Precise, Micromachined Slits, Jet Propulsion Laboratory, California Institute of Technology, Apr. 4, 2011, p. 1.
NASA Tech Briefs, Micromachined Slits for Imaging Spectrometers, NASA's Jet Propulsion Laboratory, Jun. 1, 2008, pp. 1-2.

(Continued)

*Primary Examiner* — Roberts Culbert
(74) *Attorney, Agent, or Firm* — Daly, Crowley, Mofford & Durkee, LLP

(57) ABSTRACT

A structure having an optical slit therein. The structure includes a substrate having an opening therethrough and a metal layer disposed on the substrate, such metal layer having a photolithographically formed slit therein, such slit being narrower than the opening and being disposed over the opening, portions of the metal layer disposed adjacent the slit being suspended over the opening and other portions of the metal layer being supported by the substrate.

20 Claims, 3 Drawing Sheets

(56) References Cited

OTHER PUBLICATIONS

High Power Precision Air Split Apertures, Air Slits for Optical; Infrared, Laser and other Specific Applications, High Power Air Slits—National Aperture, Inc., Sep. 6, 2011, pp. 1-3.

European Search Report dated Feb. 15, 2013, Application No. EP 12184771.9-1562, 5 pages.
Notification of European Publication Number and Information on the Application of Article 67(3) EPC dated Mar. 13, 2013, Application No. 12184771.9-1562/2583936, 2 pages.

* cited by examiner

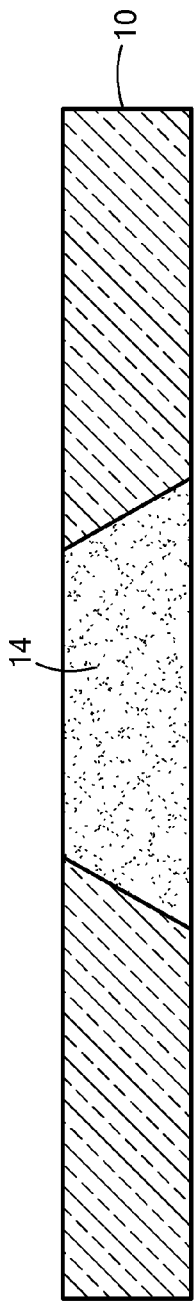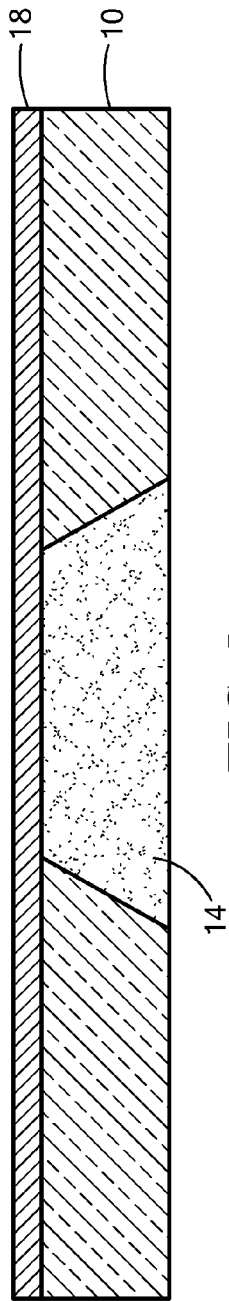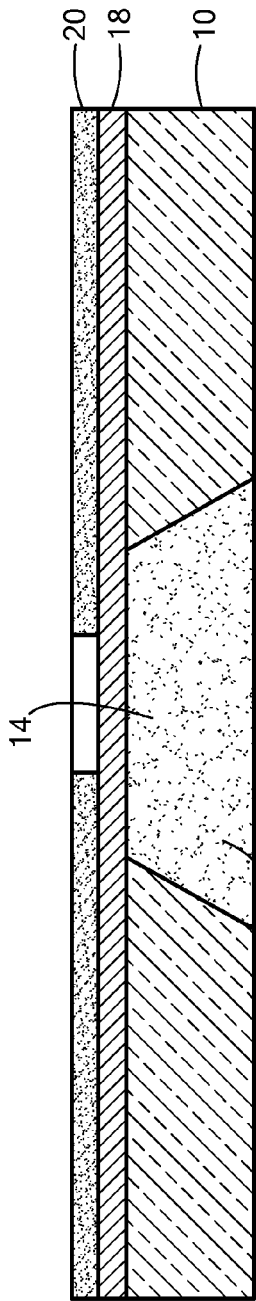

OPTICAL AIR SLIT AND METHOD FOR MANUFACTURING OPTICAL AIR SLITS

CROSS REFERENCE TO RELATED APPLICATION

This application is a divisional of and claims the benefit of application Ser. No. 13/278,254 filed Oct. 21, 2011.

TECHNICAL FIELD

This disclosure relates generally to optical slits and more particularly to method for making relatively long, narrow optical air slits.

BACKGROUND

As is known in the art, air slits have a wide range of use in optics. One such use is in hyper spectral imaging system where such systems are used to collect and process information from across the electromagnetic spectrum that can extend beyond the visible band.

As is also known, techniques used to faun air optical slits include the use of laser cutting, photolithography, Electro Discharge Machining (EDM), thin film deposition, e-beam lithography, RF/DC & reactive sputtering, Chemical Vapor Deposition (CVD), Physical Vapor Deposition (PVD). Chemical wet etch, electroplating, electro etching, spotter etching and ion milling.

SUMMARY

In accordance with the disclosure, a structure is provided having an optical slit therein, comprising: a substrate having an opening there through; and a metal layer disposed on the substrate, such metal layer having a slit therein, such slit being narrower than the opening and being disposed over the opening, portions of the metal layer disposed adjacent the slit being suspended over the opening and other portions of the metal layer being supported by the substrate.

In one embodiment, a method is provided for forming a structure having an optical slit therein. The method includes: forming an opening through a portion of a substrate; filling the opening with a sacrificial material, such material extending through a portion of the opening with portion of the material being disposed onto adjacent portions of an upper surface of the substrate; polishing the sacrificial material to remove the portions of the sacrificial material disposed onto adjacent portions of the upper surface of the substrate; forming a metalized layer on the upper surface of the substrate and the polished sacrificial material; applying a photolithographically processable material on an upper surface of the metalized layer; photolihographically forming a slit in the photolithographically processable material to expose a portion of the upper surface of the metallized layer, such slit being disposed over the opening in the portion of the substrate; etching to remove the exposed portion of the upper surface of the metalized layer to expose the sacrificial material while retaining unexposed portions of the metallized layer; and removing the sacrificial layer and the photolithographically processable material.

In one embodiment, the unexposed portions of the metallized layer are electroplated to a predetermined thickness.

In one embodiment, the electroplating is performed prior to the forming of the slit.

In one embodiment, the electroplating is performed subsequent to forming of the slit.

In one embodiment, the opening is formed using laser cutting.

The details of one or more embodiments of the disclosure are set forth in the accompanying drawings and the description below. Other features, objects, and advantages of the disclosure will be apparent from the description and drawings, and from the claims.

DESCRIPTION OF DRAWINGS

FIGS. 1-8 show a sequence of steps used to form a structure having an optical slit therein according to the disclosure.

Like reference symbols in the various drawings indicate like elements.

DETAILED DESCRIPTION

Referring now to FIGS. 1-8, steps used to form a structure having an optical slit therein are illustrated. Thus, referring to FIG. 1, a substrate 10 is provided. Here the substrate 10 is, for example, Aluminum Oxide, Silicon Nitride, Beryllium oxide or any rigid material with low coefficient of thermal expansion, here for example in the range of $0.55 \times 10^{-6}/°$ C. to $8.4 \times 10^{-6}/°$ C. Here, the substrate 10 has a thickness in the range of 3 to 10 mils.

Next, an opening 12 (FIG. 2) is formed through a portion of the substrate 10. Here, for example, the opening 12 is formed using laser cutting. The opening 12 has a span in the order 1 to 2 mils.

Figure 3:
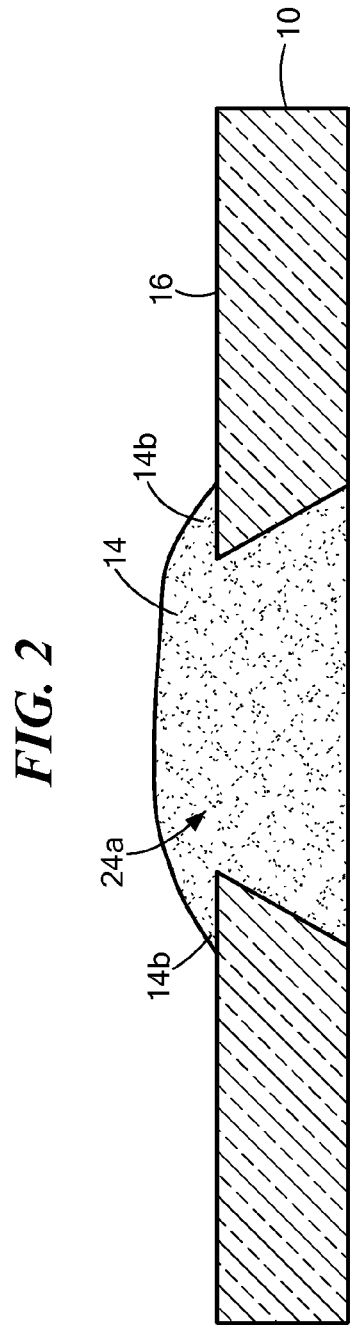

Next, the opening 12 is filled with a sacrificial material 14, such material having portions 14a extending through the opening 12 with portion 14b of the material 12 being disposed onto adjacent portions of an upper surface 16 of the substrate 10, as shown in FIG. 3. Here, the sacrificial matter 14 is adhesively bonded to the substrate 10 and is here, for example, Crystalbond 590, Manufactured by Electron Microscopy Sciences, P.O. Box 550, 1560 Industry Road, Hatfield, Pa. 19440, Sycast manufactured by Emerson & Cuming, Henkel Corporation, Canton (Electronic Materials) 869 Washington Street, Canton, Mass. 02021, United States Or AZ-photo resist AZ Electronics Materials (USA) corp., 70 Meister Ave. Somerville, N.J. 088764252, Next, the upper surface of the structure is polished to remove the portions 14a, 14b of the sacrificial material 14 disposed onto adjacent portions of the upper surface 16 of the substrate 10 as shown in FIG. 4.

Next, a metalized layer 18 is deposited, for example electroplated, on the upper surface of the substrate 12 and the polished sacrificial material 14, as shown in FIG. 5. Here, for example, the metalized layer 18 is formed by E-Beam, Sputtering, Electrolysis and laminating methods. The metallization layer 18 is here for example, a refractory metal such as titanium tungsten or chromium. Here the metallization layer 18 may be initially formed as a relatively thin seed layer, for example, having a thickness in the range of 150 to 250 Angstroms, or be formed with a thickness by electroplating in the range of 0.5 to 2 mils, Next, a conventional photolithographically processable material 20 is deposited on an upper surface of the metalized layer 18, as shown in FIG. 6.

Figure 1:
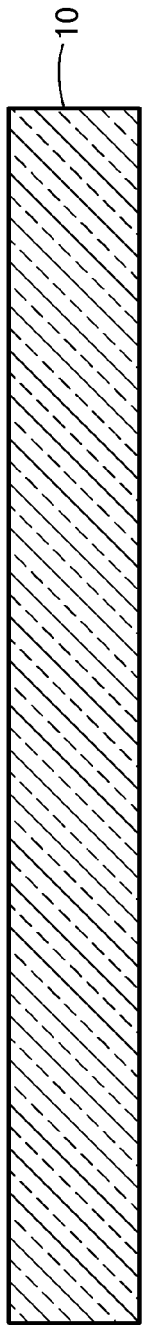
Figure 2:
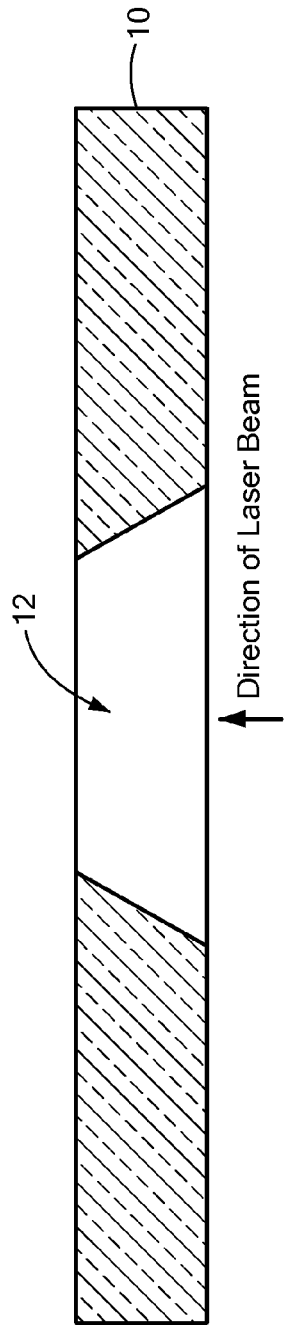
Figure 7:
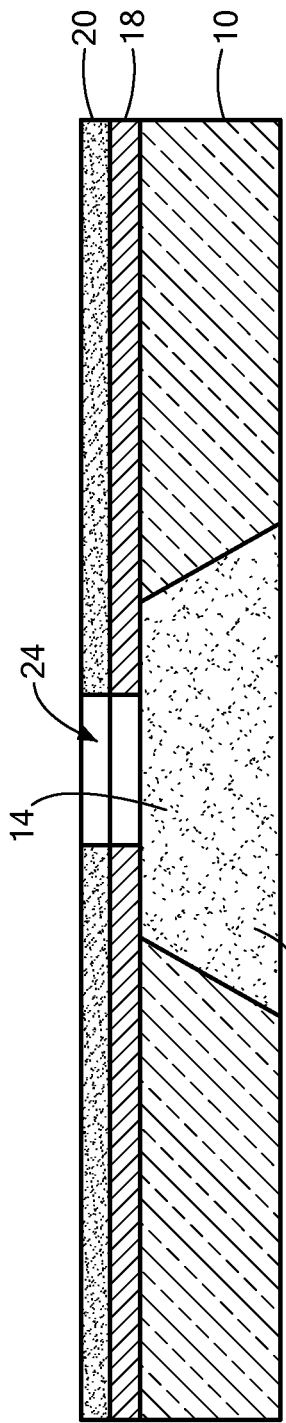

Next, a slit 24 is photolihographically formed in the photolithographically processable material 20 using any conventional photolithographic-etching technique to expose an underlying portion of the upper surface of the metallized layer 18, such slit being disposed over the filled opening 12 in FIG. 1 in the portion. of the substrate 10, as shown in FIG. 7. Here, the slit 24 has a width in the range of 5 um to 60 um and a length in the range of 77 mm to 11.2 mm.

Next, the exposed underlying portion of the metalized layer 18 is removed by any conventional etching process to foam there a slit 26 having a width in the range of 5 um to 60 um and a length in the range of 77 mm to 112 mm, as shown in FIG. 7. It is noted that the slits 24, 26 expose the sacrificial material 14 while retaining unexposed portions of the metallized layer 18.

Next, the photoresist layer 20 is removed.

Next, the metalized layer 18, here acts as a seed layer and is electroplated with material 28; here material 25 is, for example, gold, copper, nickel, chromium or any standard electroplate able metal used in the electroplating business, to form the resulting metalized layer 18 with a resulting predetermined thickness, here in the range of 0.5 mil to 1 mil; it being noted that the electroplating leaves a slit 26 in the material 28 so that slits 24, 26 are formed in the resulting metalized layer 18. It should be noted that the metalized layer 18 may be formed by electroplating the unexposed portions of the metallized layer to a predetermined thickness either prior to forming the slit 26 or subsequent to forming the slit 26.

Figure 8:
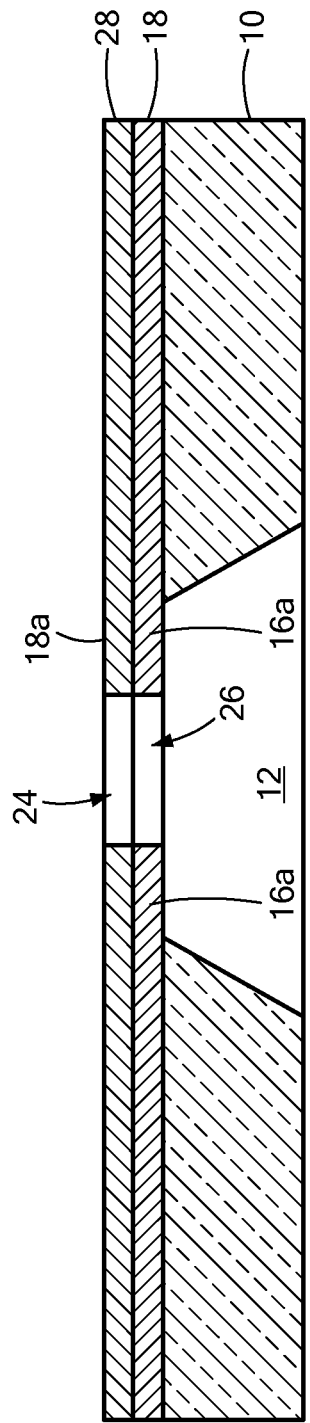

Next, the sacrificial layer 14 is removed using for example, chemical solvents, epoxy stripper, oxygen plasma, and oxygen ion milling to form the structure shown in FIG. 8. Thus, the structure shown in FIG. 8 is a structure having an optical slit 24, 26 therein, comprising: substrate 10 having the opening 12 therethrough; and a metal layer 16, 18 disposed on the substrate 10, such metal layer 16. 18 having a slit 24, 26 therein, such slit 24, 26 being narrower than the opening 12 and being disposed over the opening 12, portions of the metal layer 16a, 18a disposed adjacent the slit 24, 26 being suspended over the opening 12 and other portions of the metal layer 16, 18 being supported by the substrate 10.

A number of embodiments of the disclosure have been described. Nevertheless, it will be understood that various modifications may be made without departing from the spirit and scope of the disclosure. Accordingly, other embodiments are within the scope of the following claims.

What is claimed is:

1. A method for forming a structure having an optical slit therein, comprising;
    forming an opening vertically through the substrate from a bottom surface of the substrate to an upper surface of the substrate comprising successively removing material of the substrate from the bottom surface of the substrate through the substrate to the upper surface of the substrate;
    filling the opening with a sacrificial material, such sacrificial material extending through a portion of the opening with portion of the sacrificial material being disposed onto adjacent portions of the upper surface of the substrate;
    polishing the sacrificial material to remove the portions of the sacrificial material disposed onto adjacent portions of the upper surface of the substrate;
    forming a metalized layer on the upper surface of the substrate and the polished sacrificial material;
    applying a photolithographically processable material on an upper surface of the metalized layer;
    photolihographically forming a slit in the photolithographically processable material to expose a portion of the upper surface of the metallized layer, such slit being disposed over the opening in the portion of the substrate;
    etching to remove the exposed portion of the upper surface of the metalized layer to expose an underlying portion of the sacrificial material while retaining unexposed portions of the metallized layer;
    removing the sacrificial layer and the photolithographically processable material.

2. The method recited in claim 1 including electroplating the unexposed portions of the metallized layer to a predetermined thickness.

3. The method recited in claim 2 wherein the electroplating is performed prior to the forming of the slit.

4. The method recited in claim 2 wherein the electroplating is performed subsequent to forming of the slit.

5. The method recited in claim 1 the substrate is Aluminum Oxide, Silicon Nitride, Beryllium oxide or any rigid material having a thermal expansion in the range of $0.55 \times 10^{-6}/°C$. to $8.4 \times 10^{-6}/°C$.

6. The method recited in claim 5 wherein the substrate has a thickness in the range of 3 to 10 mils.

7. The method recited in claim 6 wherein the opening has a span in the order 1 to 2 mils.

8. The method recited in claim 7 wherein the opening is formed using laser cutting and directing the laser onto the bottom surface of the substrate.

9. The method recited in claim 5 wherein the slit 26 has a width in the range of 5 um to 60 um and a length in the range of 77 mm to 112 mm.

10. The method recited in claim 9 wherein the substrate has a thickness in the range of 3 to 10 mils.

11. The method recited in claim 10 wherein the opening has a span in the order 1 to 2 mils.

12. The method recited in claim 11 wherein the opening is formed using laser cutting and directing the laser onto the bottom surface of the substrate.

13. A method for forming a structure having an optical slit therein, comprising;
    forming an opening through a portion of a substrate;
    filling the opening with a sacrificial material, such material extending through a portion of the opening with portion of the material being disposed onto adjacent portions of an upper surface of the substrate;
    polishing the sacrificial material to remove the portions of the sacrificial material disposed onto adjacent portions of the upper surface of the substrate;
    forming a metalized layer on the upper surface of the substrate and the polished sacrificial material;
    applying a photolithographically processable material on an upper surface of the metalized layer;
    photolihographically forming a slit in the photolithographically processable material to expose a portion of the upper surface of the metallized layer, such slit being disposed over the opening in the portion of the substrate;
    etching to remove the exposed portion of the upper surface of the metalized layer to expose an underlying portion of the sacrificial material while retaining unexposed portions of the metallized layer;
    removing the sacrificial layer and the photolithographically processable material; and
    wherein the opening is formed using laser cutting and directing the laser onto a bottom surface of the substrate.

14. The method recited in claim 13 the substrate is Aluminum Oxide, Silicon Nitride, Beryllium oxide or any rigid material having a thermal expansion in the range of $0.55 \times 10^{-6}/°C$. to $8.4 \times 10^{-6}/°C$.

15. The method recited in claim 14 wherein the substrate has a thickness in the range of 3 to 10 mils.

16. A method for forming a structure having an optical slit therein, comprising;

forming an opening vertically through the substrate from a bottom surface of the substrate to an upper surface of the substrate, comprising successively removing material of the substrate from the bottom surface of the substrate through the substrate to the upper surface of the substrate, the opening having a predetermined span across the upper surface of the substrate;

filling the opening with a sacrificial material, such material extending through a portion of the opening with portion of the material being disposed onto adjacent portions of the upper surface of the substrate;

polishing the sacrificial material to remove the portions of the sacrificial material disposed onto adjacent portions of the upper surface of the substrate;

forming a metalized layer on the upper surface of the substrate and the polished sacrificial material;

applying a photolithographically processable material on an upper surface of the metalized layer;

photolihographically forming a slit in the photolithographically processable material to expose a portion of the upper surface of the metallized layer, such slit being disposed over the opening in the portion of the substrate, such slit having a span less than the span of the opening;

etching to remove the exposed portion of the upper surface of the metalized layer to form a slit in the metalized layer, such slit in the metalized layer having a span less than the span of the opening and being disposed under and in registration with the slit formed in the photolithographically processable material, the slit formed in the metalized layer exposing an underlying portion of the sacrificial material while retaining unexposed portions of the metallized layer;

removing the sacrificial layer and the photolithographically processable material.

17. The method recited in claim 16 including electroplating the unexposed portions of the metallized layer to a predetermined thickness.

18. The method recited in claim 17 wherein the electroplating is
performed prior to the forming of the slit.

19. The method recited in claim 17 wherein the electroplating is
performed subsequent to forming of the slit.

20. A method for forming a structure having an optical slit therein, comprising;

forming an opening having a predetermined span across an upper surface of the substrate, such opening passing through a portion of a substrate;

filling the opening with a sacrificial material, such material extending through a portion of the opening with portion of the material being disposed onto adjacent portions of the upper surface of the substrate;

polishing the sacrificial material to remove the portions of the sacrificial material disposed onto adjacent portions of the upper surface of the substrate;

forming a metalized layer on the upper surface of the substrate and the polished sacrificial material;

applying a photolithographically processable material on an upper surface of the metalized layer;

photolihographically forming a slit in the photolithographically processable material to expose a portion of the upper surface of the metallized layer, such slit being disposed over the opening in the portion of the substrate, such slit having a span less than the span of the opening;

etching to remove the exposed portion of the upper surface of the metalized layer to form a slit in the metalized layer, such slit in the metalized layer having a span less than the span of the opening and being disposed under and in registration with the slit formed in the photolithographically processable material, the slit formed in the metalized layer exposing an underlying portion of the sacrificial material while retaining unexposed portions of the metallized layer;

removing the sacrificial layer and the photolithographically processable material; and wherein the opening is formed using laser cutting and directing the laser onto a bottom surface of the substrate.

* * * * *